United States Patent [19]

Ryou

[11] Patent Number: 5,451,539
[45] Date of Patent: Sep. 19, 1995

[54] METHOD FOR FABRICATING CAPACITOR OF SEMICONDUCTOR MEMORY DEVICE

[75] Inventor: Eui K. Ryou, Kyoungki-do, Rep. of Korea

[73] Assignee: Hyundai Electronics Industries Co., Ltd., Rep. of Korea

[21] Appl. No.: 342,100

[22] Filed: Nov. 18, 1994

[30] Foreign Application Priority Data

Nov. 19, 1993 [KR] Rep. of Korea .................. 93-24747

[51] Int. Cl.6 ......................................... H01L 21/8242
[52] U.S. Cl. ........................................ 437/60; 437/47; 437/52; 437/919; 148/DIG. 14
[58] Field of Search ................... 437/60, 47, 52, 48, 437/919, 228; 148/DIG. 14

[56] References Cited

U.S. PATENT DOCUMENTS

| | | | |
|---|---|---|---|
| 5,362,666 | 11/1994 | Dennison | 437/47 |
| 5,372,965 | 12/1994 | Ryou | 437/47 |
| 5,389,560 | 2/1995 | Park | 437/919 |
| 5,389,566 | 2/1995 | Lage | 437/919 |

Primary Examiner—Brian E. Hearn
Assistant Examiner—Tuan Nguyen
Attorney, Agent, or Firm—Merchant, Gould, Smith, Edell, Welter and Schmidt

[57] ABSTRACT

A method for fabricating a capacitor of a semiconductor device, including the steps of: sequentially forming a planarized insulating oxide film, a barrier layer, and a first electrode layer over a semiconductor substrate; forming a first contact hole; forming electrode material spacers respectively on side walls of the first contact hole; forming a second contact hole for exposing an impurity diffusion region of the semiconductor substrate; forming a second electrode layer such that it is in contact with the impurity diffusion region; selectively removing an upper portion of the second electrode layer disposed around a region where the first contact hole is defined, thereby forming a second-electrode layer pattern; forming oxide film spacers on side walls of the second-electrode layer pattern; etching the second-electrode layer pattern, the second electrode layer and the first electrode layer until an upper surface of the barrier layer is exposed, thereby forming a first-electrode layer pattern and outer and inner electrode material walls disposed on the first-electrode layer pattern; removing the oxide film spacers; and sequentially forming a dielectric film and a plate electrode over the entire exposed surface of the resulting structure.

5 Claims, 5 Drawing Sheets

METHOD FOR FABRICATING CAPACITOR OF SEMICONDUCTOR MEMORY DEVICE

BACKGROUND OF THE INVENTION

1. Field of the Invention

The present invention relates to a method for fabricating a highly integrated semiconductor memory device, and more particularly to a method for fabricating a semiconductor memory device, capable of obtaining a sufficient storage capacitance even when a memory cell area is reduced.

2. Description of the Prior Art

Generally, a semiconductor memory device such as a dynamic random access memory (DRAM) comprises a plurality of memory cells so as to store a large quantity of information. Each of the memory cells of the semiconductor memory device includes a capacitor for storing electric charges therein and a field effect transistor for opening and closing charge and discharge passages of the capacitor. As such a DRAM has a higher integration degree, it is difficult to ensure a sufficient storage capacitance. This is because each memory cell of the DRAM has an abruptly reduced occupied area as the DRAM has the higher integration degree. Such a reduction in the occupied area of a memory cell results in a reduction in the surface area of a storage electrode included in each capacitor. Actually, the storage electrode of each capacitor which constitutes each memory cell together with each corresponding field effect transistor is formed in the form of a plane plate shape over the field effect transistor. Due to such a shape, the storage electrode has a surface area abruptly reduced as the memory cell has a reduced occupied area. In this regard, conventional methods for fabricating memory cells have difficulties in increasing the surface area of a storage electrode because they involve the formation of a storage electrode having a plane plate shape.

Referring to FIG. 1, there is illustrated a semiconductor memory device fabricated in accordance with one of the conventional methods. In FIG. 1, a semiconductor substrate 1 is shown which includes a field oxide film 2 formed on a predetermined portion of the semiconductor substrate 1, and a gate insulating film 3 and a word line 4 formed on an element region of the semiconductor substrate 1 defined by the field oxide film 2. Oxide film spacers 5 are formed on side walls of the word line 4, respectively. At exposed surface portions of the semiconductor substrate 1 defined by the oxide film spacers 5, source/drain diffusion regions 6 and 6' are formed, each of which has a lightly doped drain (LDD) structure. The source/drain diffusion regions 6 and 6' are formed by primarily implanting impurity ions in the semiconductor substrate 1 under a condition that the word line 4 is used as a mask, forming oxide film spacers on side walls of the word line 4, respectively, and then secondarily implanting impurity ions in the semiconductor substrate 1 under a condition that the oxide film spacers 5 are used as a mask. Together with the word line 4, the source/drain diffusion regions 6 and 6' constitute a field effect transistor.

Over the entire exposed surface of the resulting structure formed with the field effect transistor, an insulating oxide film 7 is coated. On the insulating oxide film 7, a storage electrode 11 is disposed which is in contact with a selected one of the source/drain diffusion regions 6 and 6'. The storage electrode 11 is formed by selectively etching the insulating oxide film 7, thereby forming a contact hole through which one of the source/drain diffusion regions 6 and 6' is exposed, forming a polysilicon layer over the entire exposed surface of the resulting structure obtained after the formation of the contact hole, and then patterning the polysilicon layer by use of a mask. On the upper surface and side walls of the storage electrode 11, a dielectric film 14 is formed using a growth process. The dielectric film 14 has a composite structure of an NO type constituted by a nitride film and an oxide film or an ONO type constituted by an oxide film, a nitride film and another oxide film. A plate electrode 15 is disposed over the entire exposed surface of the resulting structure obtained after the formation of the dielectric film 14. The plate electrode 15 is formed by forming a second polysilicon layer doped with an impurity over the entire exposed surface of the resulting structure obtained after the formation of the dielectric film 14, and then patterning the second polysilicon layer to have a predetermined dimension.

As apparent from the above description, the semiconductor device fabricated in accordance with the method of FIG. 1 has the storage electrode having the plane plate shape. Due to such a plane plate shape of the storage electrode, it is impossible to obtain a sufficient storage capacitance when the memory cell has a reduced occupied area. As a result, it is difficult for the conventional semiconductor memory device to have a high integration degree because of the insufficient storage capacitance.

SUMMARY OF THE INVENTION

Therefore, an object of the present invention is to provide a method for fabricating a capacitor of a semiconductor memory device, capable of obtaining a sufficient storage capacitance even when a memory cell area is reduced, thereby improving the integration degree of the semiconductor memory device.

In accordance with the present invention, this object can be accomplished by providing a method for fabricating a capacitor of a semiconductor memory device, comprising the steps of: preparing a semiconductor substrate formed with a transistor having an impurity diffusion region; sequentially forming a planarized insulating oxide film, a barrier layer and a first electrode layer over the semiconductor substrate; etching respective predetermined portions of the first electrode layer, the barrier layer and the insulating oxide film in a continued manner in accordance with an etch process using a contact hole mask, thereby forming a first contact hole; forming electrode material spacers respectively on side walls of the first contact hole such that the insulating oxide film is partially exposed through a region defined by the electrode material spacers; forming a second contact hole for exposing the impurity diffusion region in accordance with a selective etch process using the first electrode layer and the electrode material spacers as an etch barrel; forming a second electrode layer over the entire exposed surface of the resulting structure obtained after the formation of the second contact hole such that the second electrode layer is in electrical contact with the impurity diffusion region; selectively removing an upper portion of the second electrode layer disposed around a region where the first contact hole is defined, thereby forming a second-electrode layer pattern; forming oxide film spacers respectively on side walls of the second-electrode layer pattern; etching the second-electrode layer pattern, the second electrode layer and the first electrode layer under a condition that the oxide film spacers are used as an etch barrier until an upper surface of the barrier layer is exposed, thereby forming a first-electrode layer pattern and outer and inner electrode material walls disposed on the first-electrode layer pattern; removing the oxide film spacers, thereby exposing upper surfaces of the outer and inner electrode material walls; and sequentially forming a dielectric film and a plate electrode over exposed surfaces of the outer and inner electrode material walls, the first-electrode layer pattern and the second-electrode layer.

BRIEF DESCRIPTION OF THE DRAWINGS

These and other objects, features and advantages of the invention will become more apparent upon reading the following detailed specification and drawings, in which.

DETAILED DESCRIPTION OF THE PREFERRED EMBODIMENTS

Figure 2:
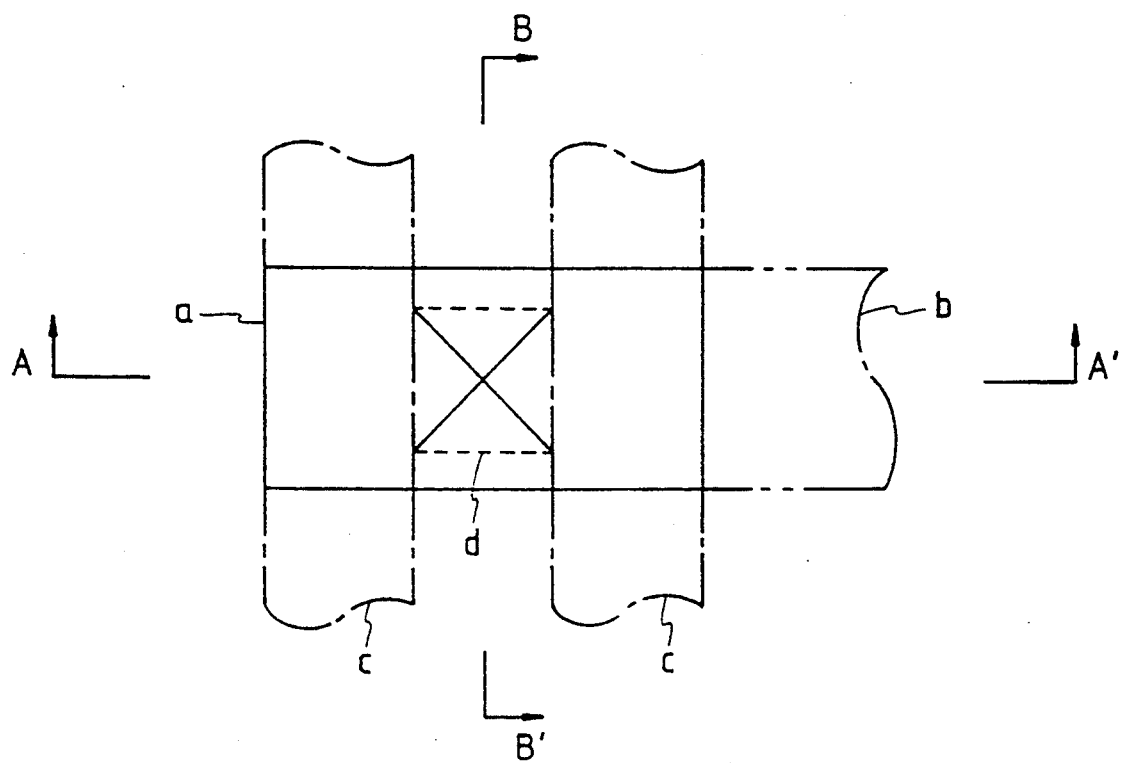
FIG. 2 is a plan view illustrating positions of mask patterns to be used in the fabrication of a capacitor of a semiconductor memory device in accordance with the present invention.

FIG. 2 is a plan view illustrating positions of mask patterns to be used in the fabrication of a capacitor of a semiconductor memory device in accordance with the present invention. In FIG. 2, various regions a to d are shown. The first region a represents a pattern of a mask for patterning a storage electrode, while the second region b represents a pattern of a mask for active region isolation adapted to isolate a region where a memory cell is disposed. On the other hand, the third region c represents a pattern of a mask adapted to be used for formation of a gate electrode and a word line, while the fourth region d represents a pattern of a mask adapted to be used for formation of a contact hole.

Figure 1:
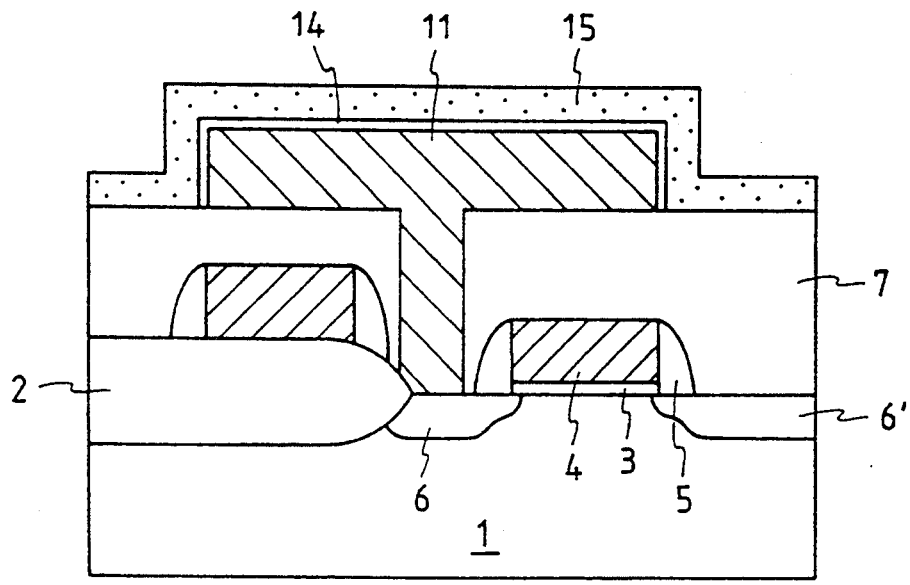
FIG. 1 is a sectional view illustrating a semiconductor memory device fabricated in accordance with a conventional fabrication method.
Figure 3A:
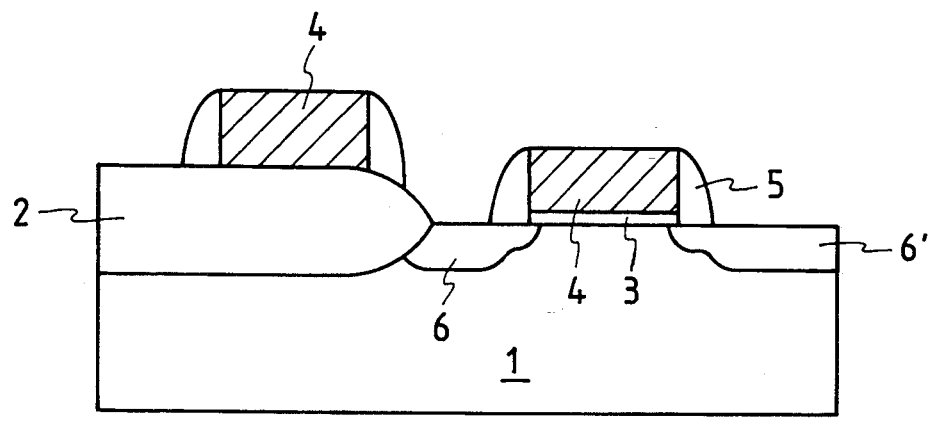
FIGS. 3A to 3F are sectional views respectively illustrating a method for fabricating a capacitor of a semiconductor memory device in accordance with a first embodiment of the present invention.
Figure 3B:
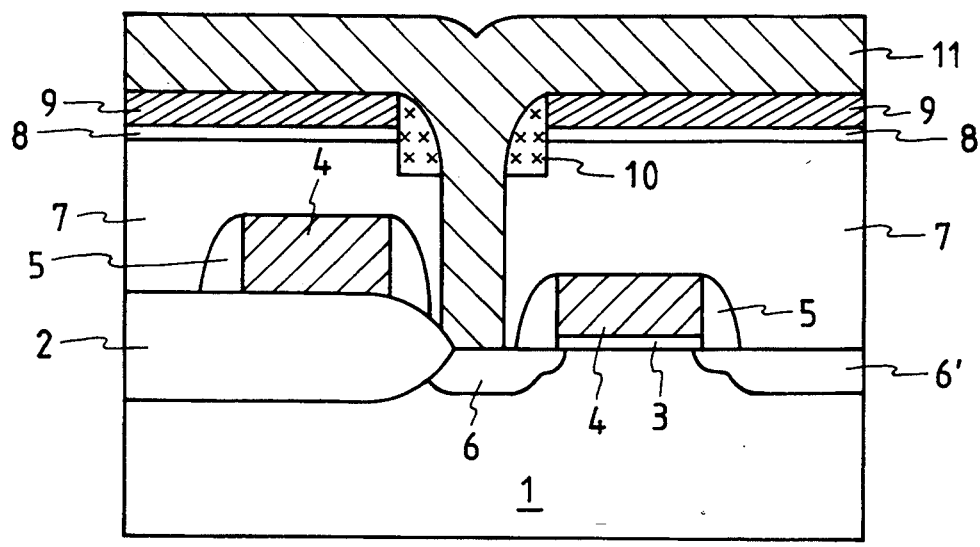
Figure 3C:
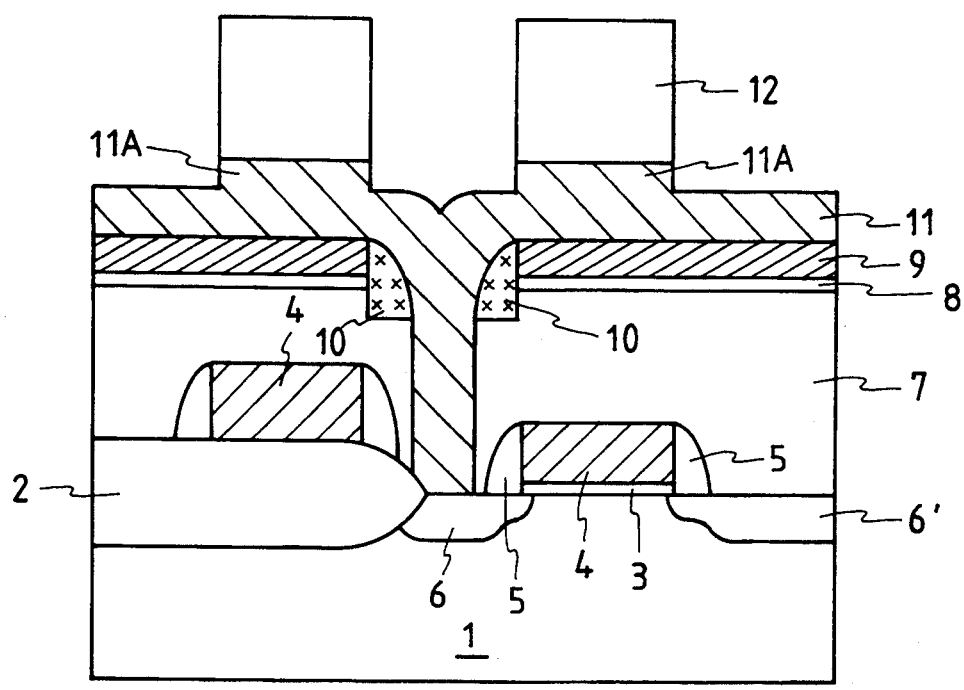
Figure 3D:
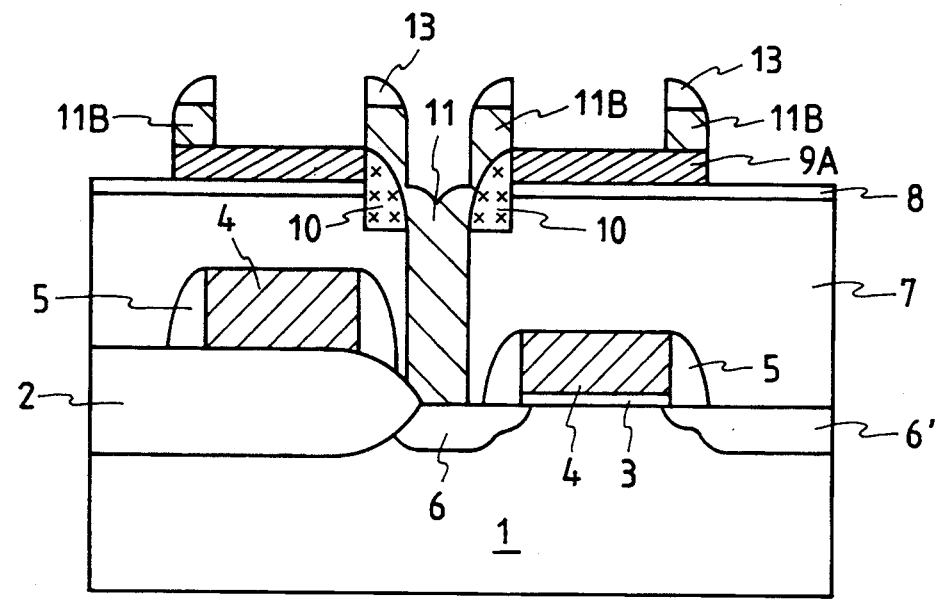
Figure 3E:
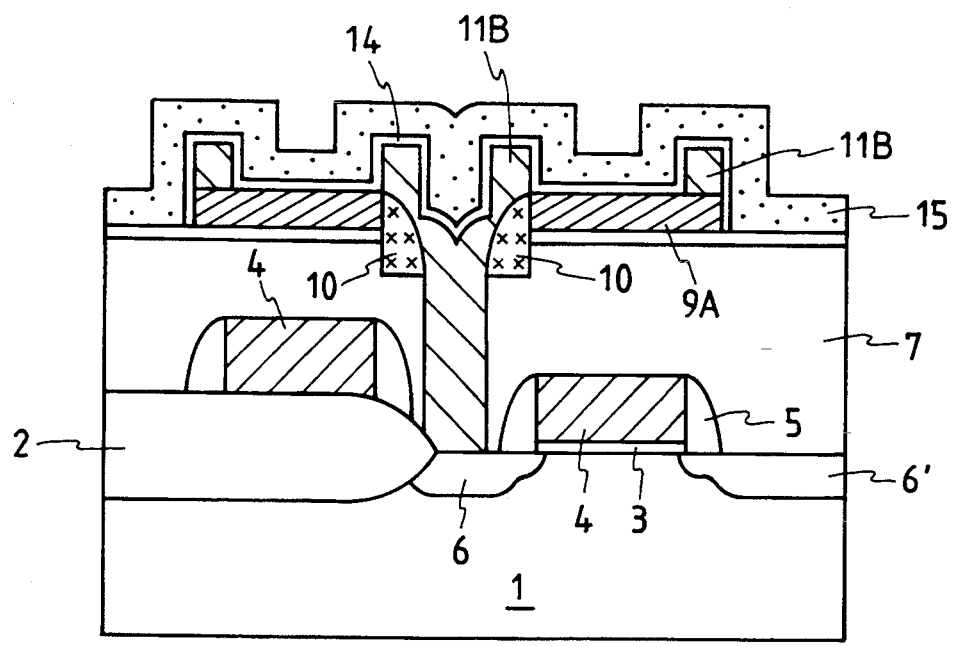
Figure 3F:
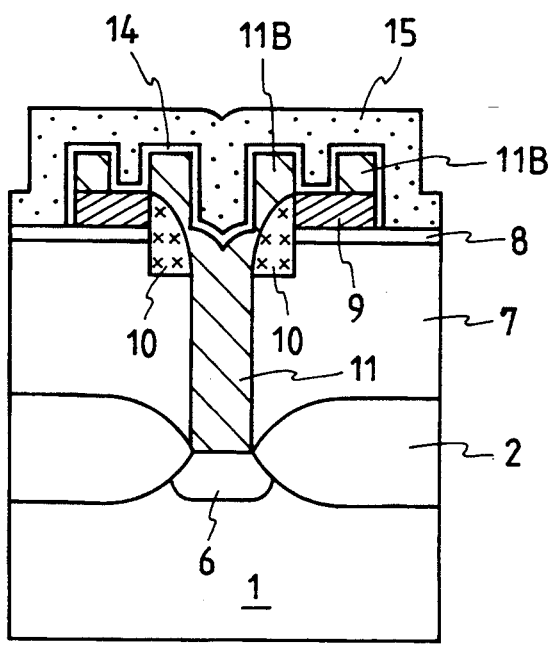

FIGS. 3A to 3F are sectional views respectively illustrating a method for fabricating a capacitor of a semiconductor memory device in accordance with a first embodiment of the present invention. FIG. 3A to 3E are cross-sectional views taken along the line A–A' of FIG. 2, respectively, while FIG. 3F is a cross-sectional view taken along the line B–B' of FIG. 2. In FIGS. 3A to 3F, elements corresponding to those in FIG. 1 are denoted by the same reference numerals.

In accordance with this method, a semiconductor substrate 1 is prepared which is formed with a field oxide film 2 at its predetermined portion where a P-well (or N-well) is formed, as shown in FIG. 3A. The field oxide film 2 is formed by growing an oxide film on the predetermined portion of semiconductor substrate 1 in accordance with a local oxidation of silicon (LOCOS) process by use of a mask which may be the mask b for active region isolation. The semiconductor substrate 1 is also formed with a gate insulating film 3 and a word line 4 at an element region defined by the field oxide film 2. The word line 4 is formed together with a gate electrode by depositing a polysilicon film over the semiconductor substrate 1 formed with the field oxide film 2, implanting impurity ions in the polysilicon film, and patterning the polysilicon film by use of a mask for gate electrode/word line which may be the mask c. Oxide film spacers 5 are formed on side walls of the word line 4, respectively. At exposed surface portions of the semiconductor substrate 1 defined by the oxide film spacers 5, source/drain diffusion regions 6 and 6' are formed, each of which has an LDD structure. The source/drain diffusion regions 6 and 6' are formed by primarily implanting impurity ions of a low concentration in the semiconductor substrate 1 under a condition that the gate electrode and word line 4 are used as a mask, forming oxide film spacers on side walls of the gate electrode and word line 4, respectively, and then secondarily implanting impurity ions of a high concentration in the semiconductor substrate 1 under a condition that the oxide film spacers 5 are used as a mask. Together with the word line 4, the source/drain diffusion regions 6 and 6' constitute a field effect transistor.

Over the entire exposed surface of the resulting structure formed with the field effect transistor, a planarized insulating oxide film 7, a barrier layer 8, a first electrode layer 9 and a second electrode layer 11 are formed in a sequential manner, as shown in FIG. 3B. Electrode material spacers are also formed between the insulating oxide film 7 and the second electrode layer 11. The insulating oxide film 7 is formed by depositing an insulating material to a predetermined thickness over the entire exposed surface of the resulting structure formed with the field effect transistor, and then fully etching a predetermined portion of the insulating material film. The barrier layer 8 is formed by coating a silicon nitride to a predetermined thickness over the insulating oxide film 7. The first electrode layer 9 is formed by depositing a polysilicon doped with an impurity over the barrier layer 8. The electrode material spacers 10 are formed by sequentially etching predetermined portions of the first electrode layer 9, barrier layer 8 and the upper portion of insulating oxide film 7 to form a first contact hole by use of a mask which may be the contact hole mask d of FIG. 2, depositing a polysilicon exhibiting a conduction characteristic to a predetermined thickness over the entire exposed surface of the resulting structure obtained after the formation of the first contact hole, and then anisotropically etching the polysilicon layer. On the other hand, the second electrode layer 11 fills a space defined by the electrode material spacers 10 and the first contact hole formed in the insulating oxide film 7 so that it is in electrical contact with a selected one of the source/drain diffusion regions 6 and 6'. The second electrode layer 11 is formed by etching an exposed portion of the insulating oxide film 7 defined by the electrode material spacers 10 to form a second contact hole through which the selected one of the source/drain diffusion regions 6 and 6' is exposed, and then depositing a polysilicon doped with an impurity over the entire exposed surface of the resulting structure obtained after the formation of the second contact hole. The electrode material spacers 10 are made of a pure polysilicon in order to improve their etch selectivity to the insulating oxide film 7. The electrode material spacers 10 will contain an impurity diffused from the first and second electrode layers 9 and 11 upon subsequently forming a dielectric film.

Over the second electrode layer 11, a photoresist film pattern 12 is formed, as shown in FIG. 3C. The formation of the photoresist film pattern 12 is achieved by coating a photoresist film over the second electrode layer 11, selectively exposing the photoresist film to light by use of the mask d for contact hole and the mask c for gate electrode/word line, and then developing the exposed photoresist film. An exposed portion of the second electrode layer 11 not disposed beneath the photoresist film pattern 12 is then etched, thereby forming a second-electrode layer pattern 11A. After the formation of the second-electrode layer pattern 11A, the photoresist film pattern 12 is removed.

Thereafter, formations of a first-electrode layer pattern 9A, second-electrode layer side walls 11B and oxide film spacers 13 are carried out, as shown in FIG. 3D. The formation of the oxide film spacers 13 is achieved by coating an oxide film having a uniform thickness over the entire exposed surface of the resulting structure obtained after the formation of the second-electrode layer pattern 11A, and then anisotropically etching the oxide film such that it remains only on side walls of the second-electrode layer pattern 11A. The first-electrode layer pattern 9A and the second-electrode side walls 11B are formed by etching the second-electrode layer pattern 11A, the second electrode layer 11 and the first electrode layer 9 by use of the oxide film spacers 13 as a mask until the barrier layer 8 is exposed. At this time, the electrode material spacers 10 serve to prevent a portion of the second electrode layer 11 disposed in the first contact hole from being excessively etched so as to prevent a short circuit between the first-electrode layer pattern 9A and the selected one of the source/drain diffusion regions 6 and 6'.

Thereafter, the oxide film spacers 13 are removed using a wet etch process, as shown in FIG. 3E. As a result, the second-electrode side walls 11B are exposed at upper surfaces thereof. Finally, formations of a dielectric film 14 and a plate electrode 15 are carried out in a sequential manner. The formation of the dielectric film 14 is achieved by growing a composite dielectric film structure of NO or ONO over the exposed surface of first-electrode layer pattern 9A, the exposed surfaces of second-electrode layer side walls 11B and the exposed surface of second-electrode layer 11. On the other hand, the plate electrode 15 is formed by depositing a polysilicon containing an impurity over the entire exposed surface of the resulting structure obtained after the formation of the dielectric film 14, and then patterning the deposited polysilicon film by use of the mask a for storage electrode. Thus, a capacitor structure in accordance with the present invention is obtained.

By referring to FIG. 3F taken along the line B–B' of FIG. 2, the capacitor structure of the present invention can be more easily understood.

Figure 4:
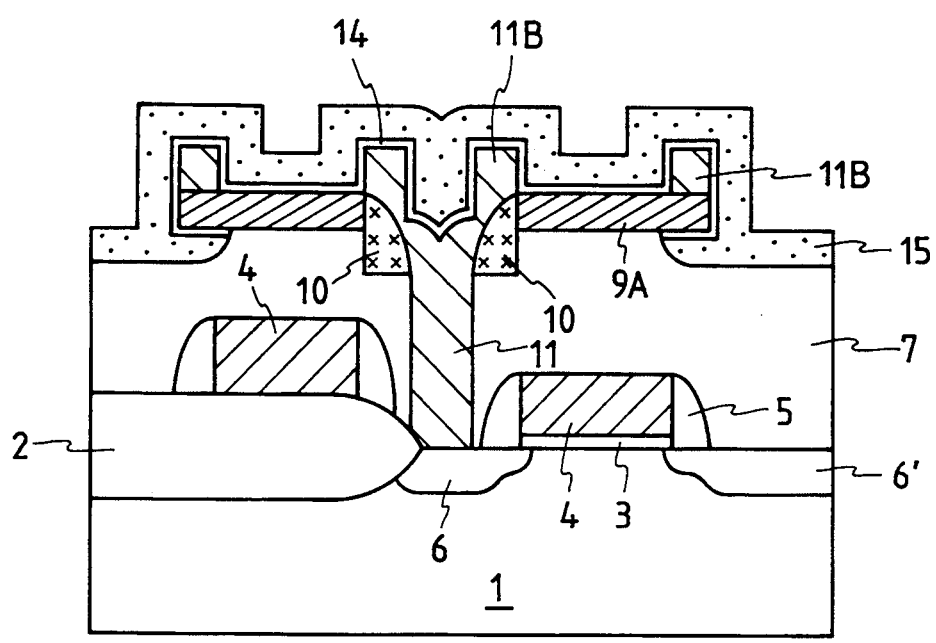
FIG. 4 is a sectional view illustrating a method of fabricating a capacitor of a semiconductor memory device in accordance with a second embodiment of the present invention.

FIG. 4 is a sectional view illustrating a method for fabricating a capacitor of a semiconductor memory device in accordance with a second embodiment of the present invention. In accordance with this method, a capacitor structure can be obtained which includes a storage electrode with a larger surface area than that of the capacitor structure fabricated in accordance with the method shown in FIGS. 3A to 3E. In accordance with the method of FIG. 4, the same steps as those shown in FIGS. 3A to 3E are carried out except that the formation of the barrier layer 8 at the step of FIG. 3B is omitted and that the insulating oxide film 7 formed at the step of FIG. 3B is etched at its portion disposed beneath the edge portion of the first-electrode layer pattern 9A upon wet etching the oxide film spacers 13 at the step of FIG. 3E.

As apparent from the above description, the present invention provides a method for fabricating a capacitor of a semiconductor memory device, capable of forming a storage electrode having rectangular inner and outer walls protruded from an electrode plate structure and thereby having a large surface area as compared to a limited occupied area of the semiconductor memory device. By virtue of the large surface area of the storage electrode, the capacitor fabricated in accordance with the method of the present invention has a large storage capacitance as compared to the limited occupied area of the corresponding memory cell. As a result, it is possible to achieve improvements in the integration degree and the reliability of the semiconductor memory device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a capacitor of a semiconductor memory device, comprising the steps of:

preparing a semiconductor substrate formed with a transistor having an impurity diffusion region;

sequentially forming a planarized insulating oxide film, a barrier layer, and a first electrode layer over the semiconductor substrate;

etching respective portions of the first electrode layer, the barrier layer and the insulating oxide film in a continued manner in accordance with an etch process using a contact hole mask, thereby forming a first contact hole;

forming electrode material spacers respectively on side walls of the first contact hole such that the insulating oxide film is partially exposed through a region defined by the electrode material spacers;

forming a second contact hole for exposing the impurity diffusion region in accordance with a selective etch process using the first electrode layer and the electrode material spacers as an etch barrier;

forming a second electrode layer over the entire exposed surface of the resulting structure obtained after the formation of the second contact hole such that the second electrode layer is in electrical contact with the impurity diffusion region;

selectively removing an upper portion of the second electrode layer disposed around a region where the first contact hole is defined, thereby forming a second-electrode layer pattern;

forming oxide film spacers respectively on side walls of the second-electrode layer pattern;

etching the second-electrode layer pattern, the second electrode layer and the first electrode layer under a condition that the oxide film spacers are used as an etch barrier until an upper surface of the barrier layer is exposed, thereby forming a first-electrode layer pattern and outer and inner electrode material walls disposed on the first-electrode layer pattern;

removing the oxide film spacers, thereby exposing upper surfaces of the outer and inner electrode material walls; and sequentially forming a dielectric film and a plate electrode over exposed surfaces of the outer and inner electrode material walls, the first-electrode layer pattern and the second-electrode layer.

2. A method in accordance with claim 1, wherein the electrode material spacers are made of a polysilicon for improving an etch selectivity thereof to the insulating oxide film.

3. A method in accordance with claim 2, wherein each of the first and second electrode layers contain an impurity for exhibiting a good conduction characteristic, the impurity being diffused in the electrode material spacers at the step of forming the dielectric film.

4. A method for fabricating a capacitor of a semiconductor memory device, comprising the steps of:

preparing a semiconductor substrate formed with a transistor having an impurity diffusion region;

sequentially forming a planarized insulating oxide film and a first electrode layer over the semiconductor substrate;

etching respective portions of the first electrode layer and the insulating oxide film in a continued manner in accordance with an etch process using a contact hole mask, thereby forming a first contact hole;

forming electrode material spacers respectively on side walls of the first contact hole such that the insulating oxide film is partially exposed through a region defined by the electrode material spacers;

forming a second contact hole for exposing the impurity diffusion region in accordance with a selective etch process using the first electrode layer and the electrode material spacers as an etch barrier;

forming a second electrode layer over the entire exposed surface of the resulting structure obtained after the formation of the second contact hole such that the second electrode layer is in electrical contact with the impurity diffusion region;

selectively removing an upper portion of the second electrode layer disposed around a region where the first contact hole is defined, thereby forming a second-electrode layer pattern;

forming oxide film spacers respectively on side walls of the second-electrode layer pattern;

etching the second-electrode layer pattern, the second electrode layer and the first electrode layer under a condition that the oxide film spacers are used as an etch barrier until an upper surface of the barrier layer is exposed, thereby forming a first-electrode layer pattern and outer and inner electrode material walls disposed on the first-electrode layer pattern;

removing the oxide film spacers by use of a wet etch process, thereby exposing upper surfaces of the outer and inner electrode material walls; and sequentially forming a dielectric film and a plate electrode over exposed surfaces of the outer and inner electrode material walls, the first-electrode layer pattern and the second-electrode layer.

5. A method in accordance with claim 4, wherein the insulating oxide film is undercut upon removing the oxide film spacers so that the first-electrode layer pattern is exposed at an edge portion of a lower surface thereof.

* * * * *